United States Patent
Ishikawa et al.

[11] Patent Number: 6,165,862
[45] Date of Patent: Dec. 26, 2000

[54] METHOD OF PRODUCING A THIN FILM RESISTOR

[75] Inventors: Eizi Ishikawa, Nukata-gun; Kenji Kondo, Hoi-gun; Hajime Soga, Toyota, all of Japan

[73] Assignee: Denso Corporation, Kariya, Japan

[21] Appl. No.: 09/143,514

[22] Filed: Aug. 28, 1998

[30] Foreign Application Priority Data

Aug. 29, 1997 [JP] Japan ................................. 9-234967

[51] Int. Cl.⁷ .................................................. H01L 21/20
[52] U.S. Cl. .......................... 438/384; 438/381; 438/382
[58] Field of Search .................................. 438/381, 382, 438/384

[56] References Cited

U.S. PATENT DOCUMENTS

| | | |
|---|---|---|
| 4,657,628 | 4/1987 | Holloway et al. ...................... 438/384 |
| 5,043,295 | 8/1991 | Ruggerio et al. . | 
| 5,420,063 | 5/1995 | Maghsoudnia et al. . |
| 5,503,878 | 4/1996 | Suzuki et al. . |
| 5,989,970 | 11/1999 | Ohkawa et al. ........................ 438/384 |

FOREIGN PATENT DOCUMENTS 7-335831  12/1995  Japan .

*Primary Examiner*—Chandra Chaudhari
*Assistant Examiner*—David S Blum
*Attorney, Agent, or Firm*—Pillsbury Madison & Sutro Intellectual Property Group

[57] ABSTRACT

After a CrSiN film and a TiW film are formed on a substrate through an intermediate insulating layer, a mask pattern is formed on the TiW film. Then a two-step dry etching treatment is performed to etch the TiW film and the CrSiN film into a specific shape. Specifically, first the TiW film is selectively etched under conditions including a large content of fluorine radicals. Then the CrSiN film is selectively etched under conditions including a large content of oxygen radicals. Accordingly, a thin film resistor can be formed with high accuracy with respect to the mask pattern.

52 Claims, 6 Drawing Sheets

|  | ONE-STEP ETCHING (COMPARATIVE EXAMPLE) | TWO-STEP ETCHING | |
|---|---|---|---|
|  |  | FIRST ETCHING | SECOND ETCHING |
| CF4/O2 (SCCM) | 20/80 | 70/30 | 10/90 |
| PRESSURE (Torr) | 0.3 | ← | ← |
| MICRO WAVE POWER (W) | 1000 | ← | ← |
| SUBSTRATE TEMPERATURE (°C) | 100 | ← | ← |

METHOD OF PRODUCING A THIN FILM RESISTOR

CROSS REFERENCE TO RELATED APPLICATION

This application is based upon and claims the benefit of priority of the prior Japanese Patent Application No. 9-234967, filed on Aug. 29, 1997, the contents of which are incorporated herein by reference.

BACKGROUND OF THE INVENTION

1. Field of the Invention

This invention relates to a method of producing a thin film resistor having a specific shape by etching a thin film resistive layer and a barrier metal layer deposited on a substrate.

2. Description of the Related Art

A thin film resistor is conventionally formed on a semiconductor device, especially on an integrated circuit (IC) chip through an insulating film, to achieve size reduction and cost reduction of the device. The thin film resistor is generally made of CrSi system material having a small thermal coefficient of resistance (TCR) such as CrSi or CrSiN.

FIGS. 8A–8D show a manufacturing process for such a thin film resistor in a stepwise manner in a case where the thin film resistor is made of CrSiN. Specifically, an insulating isolation film and circuit elements (not shown) such as MOSFETs and bipolar transistors are formed on a single crystal silicon substrate 1 by a well-known method. Then, as shown in FIG. 8A, a silicon oxide film 2 as an intermediate insulating film is deposited on the silicon substrate 1 by chemical vapor deposition (CVD) method, and a heat treatment is carried out to improve characteristics of the silicon oxide film 2. The silicon oxide film 2 secures an insulating property between the circuit elements and metallic wiring patterns.

After that, a CrSi system film 3 as a thin film resistive layer is deposited on the silicon oxide film 2, and a TiW film 4 as a barrier metal layer is deposited on the CrSi system film 3. A photoresist layer 5 is disposed on the TiW film 4 and is patterned into a specific shape. The TiW layer 4 is etched by a well-known wet etching method using the photoresist layer 5 as a mask to expose the CrSi system film 3 as shown in FIG. 8B. Next, as shown in FIG. 8C, the CrSi system film 3 is patterned by a plasma dry etching method using the stack of the photoresist layer 5 and the TiW film 4 as a mask. This method is disclosed in, for example, JP-A-7-335831. After that, the photoresist layer 5 is removed, and as shown in FIG. 8D, electrode wiring patterns 6 are formed through a well-known photo-lithography treatment. The electrode wiring pattern 6 is made of, for example, aluminum. Consequently, the thin film resistor formed from the CrSi system film 3 is provided.

In the manufacturing process described above, however, when the TiW film 4 as the barrier metal layer is etched, etching residues are readily produced and side etching is liable to occur in a lateral direction under the edge portion of the photoresist layer 5. When an initial pattern dimension of the photoresist layer 5 (see FIG. 8A) is d1 and a side etching width of the TiW film 4 is Δd, the TiW film 4 remains between the CrSi system film 3 and the photoresist layer 5 with a dimension d2 (=d1−2Δd) that is shorter than d1 by 2Δd. As a result, dispersion in processing width of the TiW film 4 is increased, so that processing accuracy of the thin film resistor is lowered.

SUMMARY OF THE INVENTION

The present invention has been made based on the above problem. An object of the present invention is to provide a method for manufacturing a thin film resistor with high accuracy by selectively etching a barrier metal layer and a thin film resistive layer.

According to the present invention, when a barrier metal layer and a thin film resistive layer are etched, the barrier metal layer is etched through a mask pattern by an etching gas under a condition that an etching selectivity of the barrier metal layer to the thin film resistive layer is larger than a specific value. The etching gas includes fluorine system gas and oxygen gas. Then, the thin film resistive layer is etched. Preferably, the specific value is approximately 10. Accordingly, side etching of the barrier metal layer can be prevented by performing the dry etching process described above instead of performing a conventional wet etching process, so that a thin film resistor can be formed with high accuracy.

Preferably, the thin film resistive layer includes chromium (Cr) and silicon (Si), and the barrier metal layer includes at least one of titanium (Ti) and tungsten (W). In this case, the thin film resistor formed from the thin film resistive layer can have a small thermal coefficient of resistance. The barrier metal layer can be prevented from reacting with wiring patterns electrically contacting the barrier metal layer.

Preferably, the barrier metal layer is etched using the etching gas in which a content of the fluorine system gas is larger than that of the oxygen gas, and the thin film resistive layer is etched using the etching gas in which the content of the oxygen gas is larger than that of the fluorine system gas. Accordingly, even when over-etching is performed on the barrier metal layer, the mask pattern and the thin film resistive layer are not etched excessively and the barrier metal layer can be selectively etched with high accuracy. Then in the etching of the thin film resistive layer, the thin film resistive layer can be selectively etched using the barrier metal layer as a mask with high accuracy.

The fluorine system gas may be tetrafluoro carbon ($CF_4$) gas. In this case, the barrier metal layer including Ti or W is etched mainly by the $CF_4$ gas, and the thin film resistive layer including Cr and Si is etched by $CF_4$ gas and oxygen gas. It is not necessary to change the etching gas in the steps of etching the barrier metal layer and the thin film resistive layer.

Preferably, in the step of etching the barrier metal layer, a ratio of an oxygen gas flow rate to an entire etching gas flow rate is set in a range of 20% to 70%. More preferably, the ratio of the oxygen gas flow rate to the entire etching gas flow rate is set less than 50%. Accordingly, the etching selectivity of the barrier metal layer to the thin film resistive layer can be increased. When the thin film resistive layer is formed on the substrate through an oxide film, in the step of etching the thin film resistive layer, the ratio of the oxygen gas flow rate to the entire etching gas flow rate is preferably set to more than 80%. Accordingly, an etching selectivity of the thin film resistive layer to the oxide film can be increased.

The mask pattern can be made of organic material including C—H groups. In this case, in the step of etching the barrier metal layer, the C—H groups are transformed to C—F groups by the fluorine system gas in the etching gas. Therefore, in the successive etching step for the thin film resistive layer, even when the content of the oxygen gas in the etching gas is increased, the mask pattern is not easily etched by the etching gas.

BRIEF DESCRIPTION OF THE DRAWINGS

Other objects and features of the present invention will become more readily apparent from a better understanding of a preferred embodiment described below with reference to the following drawings in which.

DETAILED DESCRIPTION OF THE PREFERRED EMBODIMENT

A preferred embodiment of the present invention will be explained referring to FIGS. 1 to 7. A manufacturing process for a thin film resistor 12 in this embodiment is shown in FIGS. 1A–1D in a stepwise manner, and the resulting thin film resistor 12 is shown in FIG. 1D.

Figure 1A:
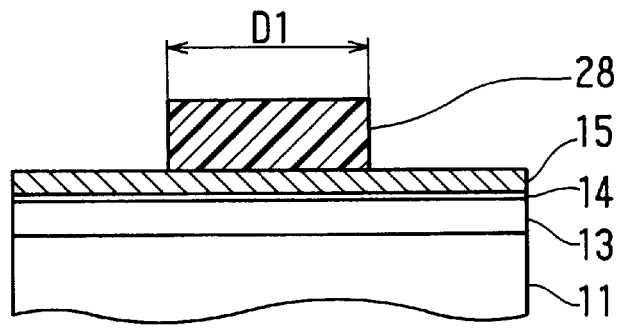
FIGS. 1A–1D are cross-sectional views that show a manufacturing process of a thin film resistor in a stepwise manner in accordance with a preferred embodiment of the present invention.
Figure 1B:
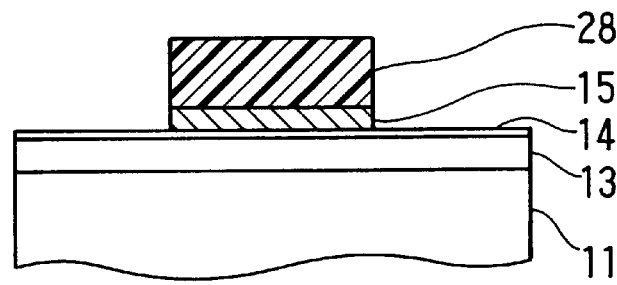
Figure 1C:
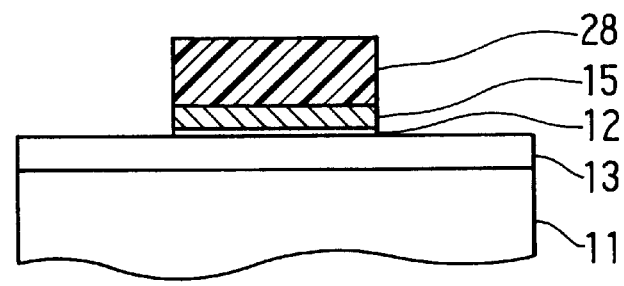
Figure 1D:
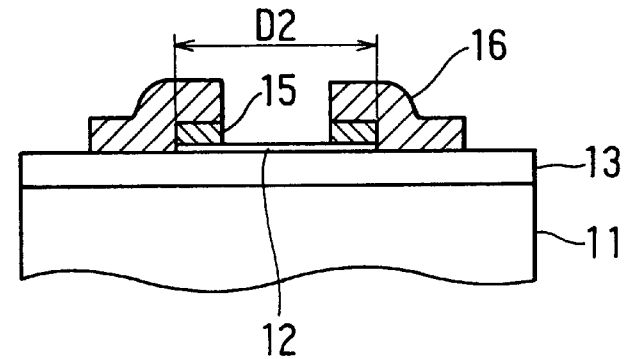

Referring to FIG. 1D first, the thin film resistor 12 is formed on a silicon oxide film 13 with a specific shape. The silicon oxide film 13 is formed on a single crystal silicon substrate (semiconductor substrate) 11 as an intermediate insulating film after elements are formed on the silicon substrate 11 through a specific element formation process. The thin film resistor 12 is formed from a CrSiN film 14 (see FIG. 1A), which is formed by sputtering a CrSi sintered body in an atmosphere including nitrogen gas. The thickness of the thin film resistor 12 is preferably 15 nm. The CrSiN film 14 for forming the thin film resistor 12 includes nitrogen so that it has a small thermal coefficient of resistance (TCR), which represents a dispersion value of resistance in accordance with temperature. Accordingly, the operational stability of the thin film resistor 12 with respect to temperature is improved.

A TiW film 15 is disposed on both end surface portions of the thin film resistor 12 as a barrier metal layer to directly contact electrode patterns 16. The TiW film 15 prevents the thin film resistor 12 from deteriorating due to reaction with the electrode patterns 16. The thickness of the TiW film 15 is preferably 250 nm. The electrode patterns 16 are made of aluminum and are formed to cover the TiW film 15 on both of the end surface portions of the thin film resistor 12. In this way, the thin film resistor 12 is provided between the aluminum electrode patterns 16.

Figures 2, 3:
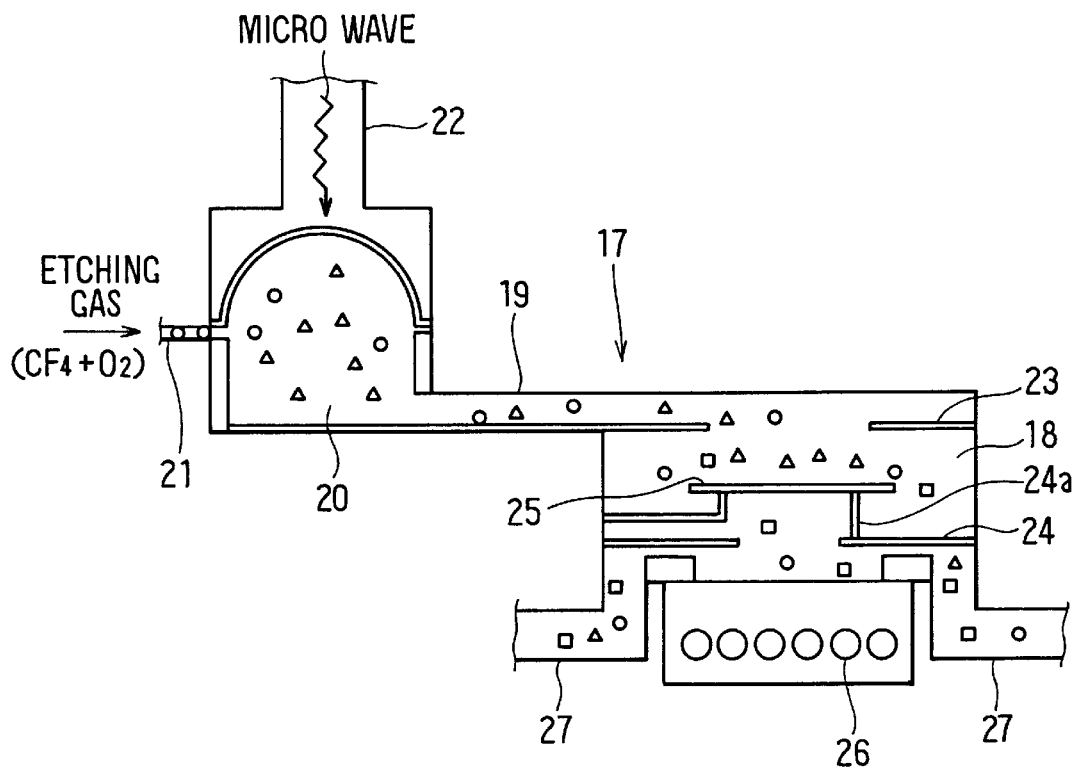
FIG. 2 is a schematic view showing a chemical dry etching apparatus used in the embodiment.
FIG. 3 is a chart indicating etching conditions.
Figure 4:
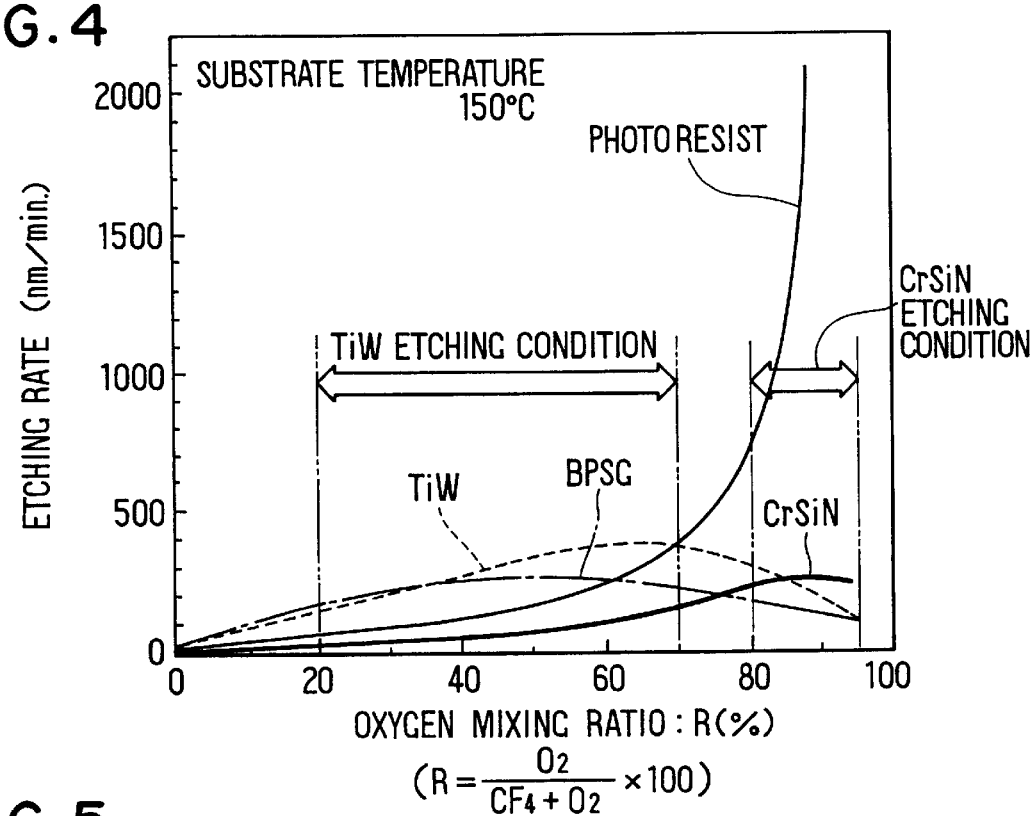
FIG. 4 is a correlation diagram showing etching rates of respective films with respect to an oxygen mixing ratio.
Figure 5:
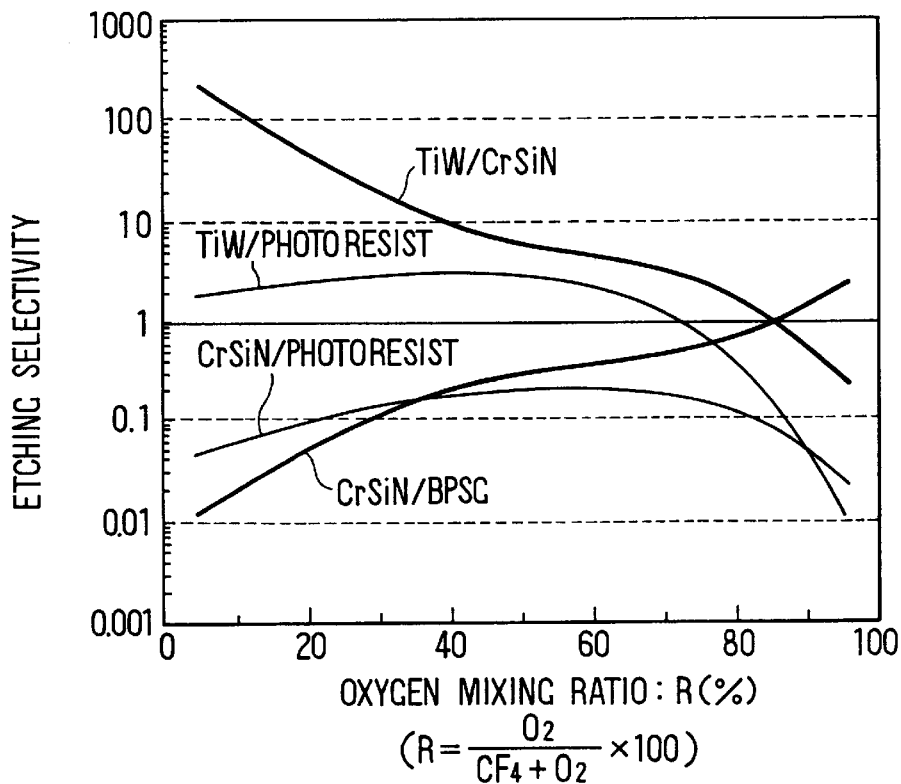
FIG. 5 is a correlation diagram showing etching selectivities between sets of two films with respect to the oxygen mixing ratio.

The thin film resistor 12 described above is formed through an etching treatment. Herebelow, a chemical dry etching (CDE) apparatus 17 used in the etching treatment will be briefly explained. Referring to FIG. 2, the chemical dry etching apparatus 17 has an etching reaction chamber 18 and a plasma generation chamber 20 communicating with the etching reaction chamber 18 through a gas passage 19.

The plasma generation chamber 20 has a gas introduction port 21 for introducing an etching gas to the plasma generation chamber 20. The etching gas contains tetrafluoro carbon ($CF_4$) and oxygen ($O_2$). A wave guide 22 is connected to the plasma generation chamber so that micro wave can be irradiated inside the plasma generation chamber 20 through the wave guide 22. When the micro wave is introduced into the plasma generation chamber 20, the etching gas within the plasma generation chamber 20 is excited into a plasma state, and is activated. The activated etching gas is supplied into the etching reaction chamber 18 through the gas passage 19.

In the etching chamber 18, a gas rectification plate 23 is disposed at an upper portion, and a substrate holding member 24 is disposed at a lower central portion. The gas rectification plate 23 rectifies the etching gas supplied from the plasma generation chamber 20 so that the etching gas uniformly contacts a substrate (wafer) 25, which is an etching object and is disposed on the substrate holding member 24. The substrate holding member 24 has support pins 24a for supporting the substrate 25. In this state, the substrate 25 is etched while being heated by radiation heat developed from a heating lamp 26 which is disposed under the substrate 25.

The etching reaction chamber 18 has exhaust ports 27 at the lower portion of the substrate holding member 24 and at the side portion of the lamp 26. The exhaust ports 27 communicate with an exhaust system for reducing pressure inside of the etching reaction chamber 18 and for discharging the etching gas and reaction products from the etching reaction chamber 18. In FIG. 2, the non-excited etching gas is indicated with a circle (○) mark, and the excited etching gas is indicated with a triangle (Δ) mark, and accordingly a flow path of the etching gas is known. A square (□) mark represents the reaction products.

Next, the process of manufacturing the thin film resistor 12 will be explained referring to FIGS. 1A–1D. First, an insulating film and circuit elements such as MOSFETs and bipolar transistors, which are not shown, are formed on the single crystal silicon substrate 11. Then, the silicon oxide film 13 is deposited on the silicon substrate 11 by a CVD method to serve as an intermediate insulating film for securing an insulating property between the circuit elements and metallic wiring patterns disposed thereon. An annealing treatment is thereafter carried out on the silicon oxide film 13 under specific conditions so that the density of the silicon oxide film 13 is increased.

After that, the CrSiN film 14 as the thin film resistive layer is deposited on the silicon oxide film 13, and the TiW film 15 as the barrier metal layer is deposited on the CrSiN film 14. The CrSiN film 14 is deposited by reactive sputtering using a CrSi sintered body as a target in an atmosphere including nitrogen ($N_2$) gas and argon (Ar) gas. The preferable thickness of the CrSiN film 14 is approximately 15 nm. The TiW film 15 is also deposited by sputtering in an Ar atmosphere.

Subsequently, a photoresist layer made of organic material is coated on the TiW film 15 to have a thickness of for example approximately 1 $\mu$m leaving a surface portion of the TiW film 15 exposed. The photoresist layer is patterned by a well-known photo-lithography treatment into a specific shape corresponding to the thin film resistor 12, thereby forming a mask pattern 28. The photoresist layer is specifically made of phenol resin (novolak resin) and includes C—H groups, each of which is composed of a carbon atom and a hydrogen atom combined with one another.

Then, the etching treatment is carried out in the following manner using the chemical dry etching apparatus 17 described above so that the TiW film 15 and the CrSiN film 14 are etched, respectively. First, the single crystal silicon substrate 11 is disposed on the substrate holding member 24 as the substrate 25 and is supported by the support pins 24a thereon. In this state, the etching gas is introduced to conduct the etching treatment. In this embodiment, a two-step etching treatment is adopted. The two-step etching treatment includes two steps for etching the TiW film 15 and the CrSiN film 14, respectively, under conditions different from one another. As shown in FIG. 3, a main difference between the two etching steps, i.e., between first and second steps, is to change a mixing ratio of $CF_4$ gas to $O_2$ gas in the etching gas.

Specifically, in the first step for etching the TiW film 15, a ratio (oxygen mixing ratio) R (%) of $O_2$ gas flow rate relative to the entire etching gas flow rate is set in an optimum range of 20% to 70%, for example at 30%. Accordingly, the mixing ratio of the fluorine component in the etching gas is set at a large value. Further, to set conditions so that the CrSiN film 14 is not easily etched, as understood from FIG. 4, the ratio R is preferably equal to or smaller than 50%. Also in view of securing a large etching selectivity of the TiW film 15 relative to the CrSiN film 14, as a result shown in FIG. 5, it is preferable that the ratio R is equal to or smaller than 50%, so that the etching selectivity of the TiW film 15 relative to the CrSiN film 14 becomes large. The lower limit value of the ratio R is preferably around 20% so that the decrease in $O_2$ gas flow rate does not cause the formation of a film on the CrSiN film 14, because the formation of a film on the CrSiN film 14 adversely affects the etching in the second step.

In the second step for etching the CrSiN film 14, the optimum range of the ratio R is 80% to 95%, and the ratio R is set at, for example, 90% so that the mixing ratio of the oxygen component in the etching gas becomes large. The other etching conditions such as etching gas pressure, micro wave power, and substrate temperature are common in the first and second steps. As shown in FIG. 3, the etching gas pressure has the optimum range of 0.6±0.4 Torr, and is set at, for example, 0.3 Torr. The micro wave output has the optimum range of 1000±600 W, and is set at, for example, 1000 W. The substrate temperature raised by the lamp 26 has the optimum range from room temperature to 200° C., and is set at, for example, 100° C. A one-step etching treatment in FIG. 3 is a conventional method and will be described later.

When the first and second steps are carried out under the etching conditions described above, the etching gas is first introduced into the plasma generation chamber 20 and the micro wave is irradiated to the etching gas. Accordingly, the molecules in the etching gas are excited, so that fluorine radicals and oxygen radicals, which have high reactivity, are produced from the fluorine and oxygen components. The fluorine and oxygen radicals flow into the etching reaction chamber 18 through the gas passage 19. Then, the etching treatment is carried out by the fluorine and oxygen radicals.

The etching of the TiW film 15 and the intermediate insulating film 13 mainly uses the fluorine radicals, and the etching of the CrSiN film 14 mainly uses both of the fluorine radicals and the oxygen radicals. It is considered that the above-mentioned etching steps progress with reactions expressed by the following reaction formulas (1), (2), (3);

$$TiW + F^* + O^* \rightarrow TiF_4\uparrow + WF_6\uparrow + WOF_x\uparrow \quad (1)$$

$$CrSi + F^* + O^* \rightarrow CrO_xF_y\uparrow + SiF_4\uparrow \quad (2)$$

$$SiO_2 + F^* \rightarrow SiF_4\uparrow \quad (3)$$

where F* indicates fluorine radicals and O* indicates oxygen radicals. That is, titanium (Ti) and tungsten (W) in the TiW film 15 combine with fluorine and oxygen radicals, respectively, to be removed from the TiW film 15. Concerning the CrSiN film 14, chromium (Cr) and silicon combine with fluorine and oxygen radicals, respectively, to be removed from the CrSiN film 14. In the intermediate insulating film 13, silicon combines with fluorine radicals to be removed from the intermediate insulating film 13.

The flow rates of $CF_4$ gas and $O_2$ gas for the first and second steps, described above, are fixed based on the data shown in FIGS. 4 and 5, that is, based on characteristics of etching rates of the respective films and of the etching selectivity between the respective two films with respect to the oxygen mixing ratio R.

In the case where the Ti, W system and CrSi system thin films are successively dry-etched, generally it is preferable that the etching is carried out by one step. However, under the conditions for providing a high selectivity of the thin films relative to the intermediate insulating film 13 underlying the films, the mask pattern 28 made of photoresist is easily etched by the oxygen radicals, and accordingly the accuracy of the processing pattern width of the thin film resistor 12 is lowered. Therefore, in this embodiment, the two-step etching is adopted.

In the first step, the TiW film 15 is selectively etched under the conditions described above (see FIG. 1B). At that time, the etching rate of the TiW film 15 is lowered in the vicinity of the mask pattern 28 by approximately ⅔ relative to that of the other portions. Therefore, to solve this problem, an over-etching of more than 50% is performed. That is, the etching time of the etching treatment is set 1.5 times longer than the etching time which is fixed in accordance with the etching rate. Accordingly, the TiW film 15 is securely, so that unetched portions do not remain in the vicinity of the mask pattern 28.

However, in this case, when the TiW film 15 remaining only in the vicinity of the mask pattern 28 is etched while practicing this over-etching technique, the CrSiN film 14 is exposed at the other portions. Therefore, it is necessary that the etching rate of the CrSiN film 14 is small during this over-etching technique. This is because if the CrSiN film 14, which has a thickness much thinner than that of the TiW film 15, is removed during the over-etching, the intermediate insulating film can become exposed. The fluorine radicals then cause the intermediate insulating film 13 to be etched. This results in decrease of the etching rate of the TiW film 15 and decrease of the thickness of the intermediate insulating film 13.

Figure 7A:
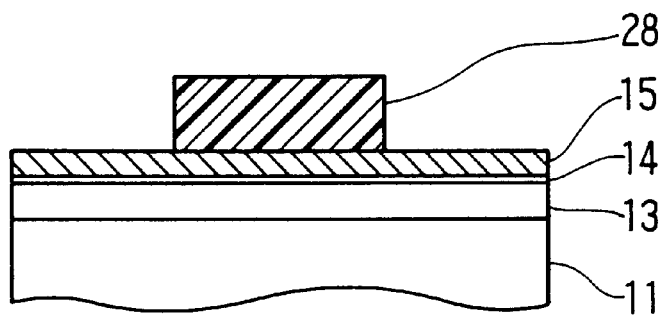
FIGS. 7A–7C are cross-sectional views for explaining a problem when etching conditions of a two-step etching treatment are not optimized.
Figure 7B:
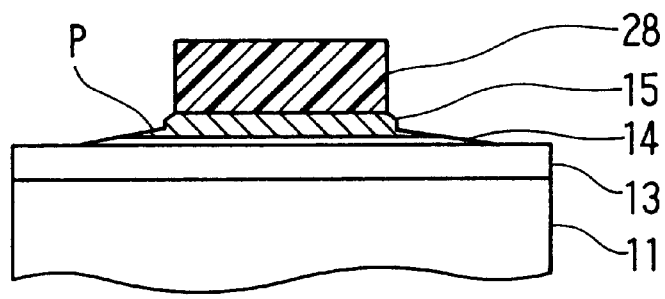
Figure 7C:
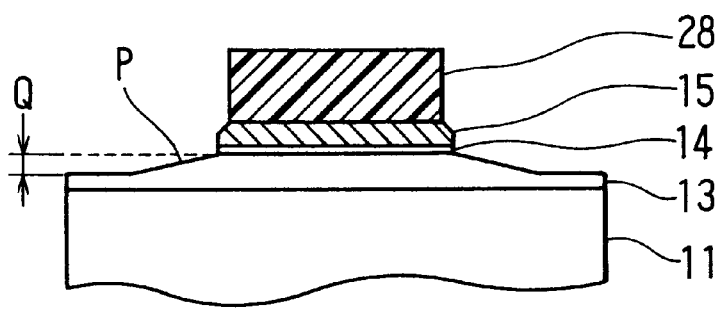
Figure 8A:
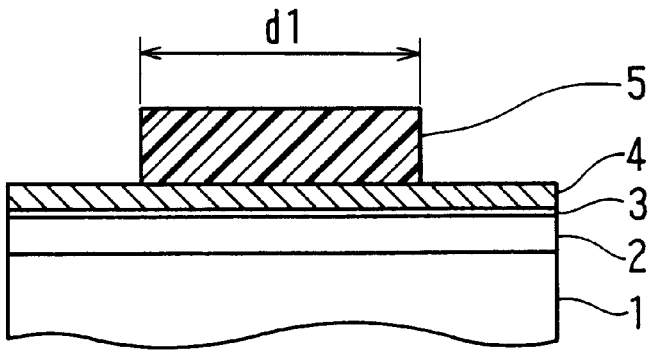
FIGS. 8A–8D are cross-sectional views showing a conventional manufacturing process for making a thin film resistor in a stepwise manner.
Figure 8B:
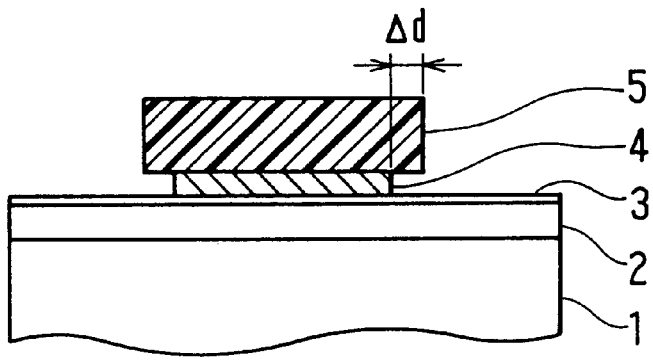
Figure 8C:
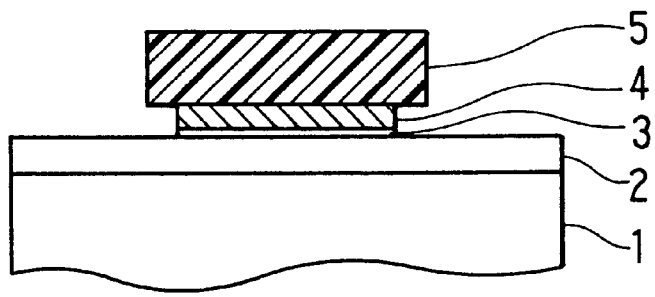
Figure 8D:
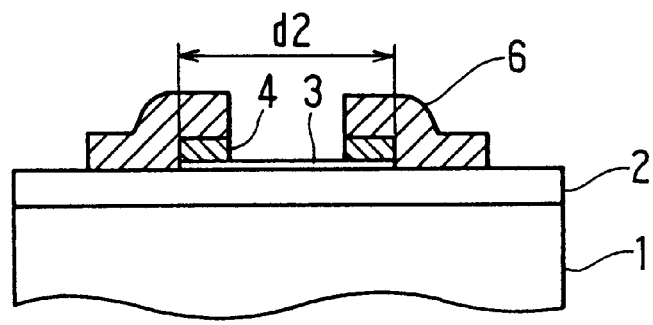

In more detail, for example, when the etching treatment is started from the state shown in FIG. 7A, which is substantially the same as that shown in FIG. 1A, a region P remains in the vicinity of the mask pattern 28 with a wide-based shape due to the decrease of the etching rate of the TiW film 15 occurring around the mask pattern 28 (see FIG. 7B). Then, the over-etching is carried out to remove the region P. As a result, however, the etched amount Q of the intermediate insulating film 13 is increased as shown in FIG. 7C.

Therefore, it is necessary that the etching conditions for the TiW film 15 are determined so that the CrSiN film 14 serves as an etching stopper. Specifically, it is necessary that the etching conditions are determined so that the CrSiN film 14 remains on the entire surface of the intermediate insulating film 13 until the region P of the TiW film 15 is removed by etching.

Therefore, in this embodiment, in consideration of all the above, it is preferable for the first step of etching the TiW film 15 that the selectivity of the TiW film 15 relative to the CrSiN film 14 is equal to or larger than 10. To comply with this preference, the ratio of the $CF_4$ gas flow rate to the $O_2$ gas flow rate is fixed as shown in FIG. 3.

Next, in the second step, the CrSiN film 14 is etched as shown in FIG. 1C. In this case, the stack of the mask pattern 28 and the TiW film 15 serve as a mask member. In the second step, an over-etching of more than 100% is carried out. The etching gas includes a large amount of the oxygen radicals. Accordingly, the etched amount of the intermediate insulating film 13 is suppressed at 50 nm or less in thickness. On the other hand, the large amount of the oxygen radicals causes the etching of the mask pattern 28 at a high etching rate.

However, the mask pattern 28 is made of material including C—H groups, and the fluorine radicals are substituted with hydrogen atoms in the C—H groups during the etching of the TiW film 15. Accordingly, C—F groups are produced in the mask pattern 28. Therefore, even when the etching of the CrSiN film 14 is carried out under the conditions including the large amount of the oxygen radicals, the mask pattern 28 is not easily etched to produce CO. This is because the bonding strength of each of the C—F groups is larger than that between carbon and hydrogen (C—H). Incidentally, the etching rates of the photoresist in FIG. 4 were obtained from the photoresist, a surface region of which was not transformed by the fluorine radicals.

Further, in the second step, the etching rate of the TiW film 15 (serving as the barrier metal layer) is controlled to be approximately equal to that of the CrSiN film 14. Therefore, even when the mask pattern 28 is completely removed by the etching, the etched amount of the TiW film 15 can be suppressed to approximately 30 nm in thickness. Therefore, the TiW film 15 can be prevented from being under-etched. A difference between a pattern width D1 (see FIG. 1A) of the mask pattern 28 and a resulting pattern width D2 of the thin film resistor 12 (see FIG. 1D) is only 0.2 μm or less. Thus, the patterning of the thin film resistor 12 can be performed with high accuracy.

Figure 6:
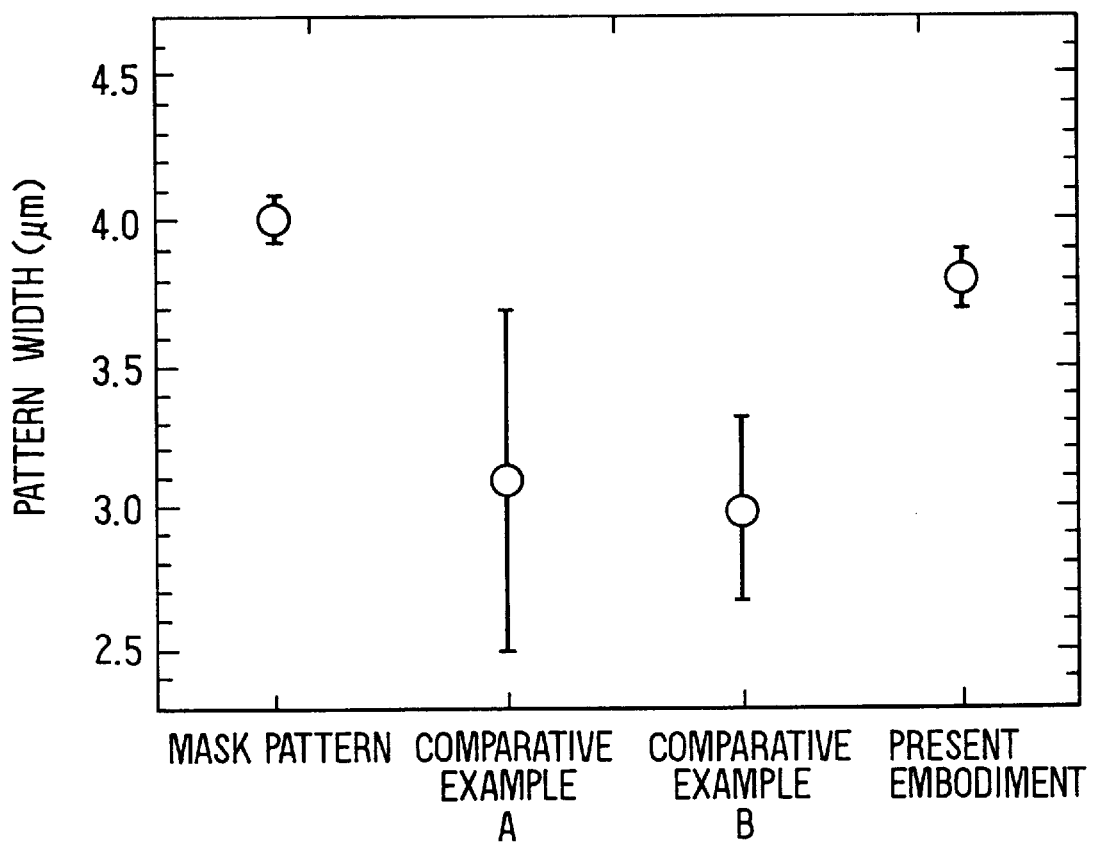
FIG. 6 is a graph showing pattern widths of the thin film resistors formed by different techniques.

This is apparent also from the experimental result shown in FIG. 6, obtained by the inventors of the present invention. FIG. 6 shows the pattern width of the mask pattern 28, which is around 4 μm, and the resulting pattern widths of the thin film resistors 12 etched by several methods using the mask patterns 28. When a conventional etching treatment in which the TiW film is etched by a wet etching step and the CrSi system film is etched by a dry etching step is carried out as a comparative example A, the pattern width is approximately 3.1 μm in average and has ±0.5 μm in dispersion. When the TiW film and the CrSi system film are dry-etched by one step under conditions shown in FIG. 3 as a comparative example B, the pattern width is 2.9 μm in average and has ±0.3 μm in dispersion. As opposed to this, when the two-step etching in this embodiment is carried out, the pattern width is 3.8 μm in average and has ±0.1 μm or less in dispersion. Accordingly, it is confirmed that the two-step etching in this embodiment can provide the pattern width of the thin film resistor 12 sufficiently close to that of the mask pattern 28 with small dispersion.

Then, from the state shown in FIG. 1C, the mask pattern 28 is removed by a well-known photo-lithography treatment, and an aluminum layer is formed on the entire surface of the substrate. The aluminum layer is patterned to form the aluminum electrode patterns 16 contacting both of the end surface portions of the thin film resistor 12. At that time, the TiW film 15 exposed on the thin film resistor 12 is removed together with the aluminum layer. Accordingly, the thin film resistor 12 electrically contacting the aluminum electrode patterns 16 through the TiW film 15 as the barrier metal layer can be formed.

In this embodiment, the etching treatment for the TiW film 15 as the barrier metal layer and the CrSiN film 14 as the thin film resistive layer includes the two dry etching steps, which are successively performed. Accordingly, the number of the manufacturing steps is reduced, resulting in cost reduction. Further, the thin film resistor 12 can be formed with high accuracy with respect to the pattern width of the mask pattern 28 and with small dispersion. The dispersion in the process for forming the thin film resistor 12 is also reduced. It is not necessary for pattern design to set a large margin, resulting in reduction of the element formation area.

While the present invention has been shown and described with reference to the foregoing preferred embodiments, it will be apparent to those skilled in the art that changes in form and detail may be made therein without departing from the scope of the invention as defined in the appended claims.

For example, a reactive ion etching (RIE) apparatus, an inductively coupled plasma (ICP) apparatus or the like can be used in stead of the CDE apparatus. The material for the thin film resistor is not limited to CrSiN, and may be made of, for example, CrSi. The barrier metal layer may be made of Ti or W instead of TiW. The flow rate of the etching gas can be appropriately changed with an appropriate mixing ratio, and in this case, the other etching conditions such as the pressure, micro wave output, and the substrate temperature may be controlled if necessary.

What is claimed is:

1. A method of manufacturing a thin film resistor on a substrate, the method comprising:

forming a thin film resistive layer on the substrate;

forming a barrier metal layer on the thin film resistive layer;

forming a mask pattern on the barrier metal layer to expose a surface portion of the barrier metal layer;

etching the barrier metal layer from the exposed surface portion through the mask pattern with an etching gas, the etching gas including fluorine system gas and oxygen gas and being activated by plasma; and etching the thin film resistive layer.

2. The method of claim 1, wherein:

the thin film resistive layer includes chromium and silicon; and the barrier metal layer includes at least one of titanium and tungsten.

3. The method of claim 1, wherein:

the etching gas for said etching of the barrier metal layer has a content of the fluorine system gas that is larger than a content of the oxygen gas in the etching gas; and said etching of the thin film resistive layer is performed with the etching gas modified so that the content of the oxygen gas is larger than the content of the fluorine system gas.

4. The method of claim 1, wherein said etching of the barrier metal layer and said etching of the thin film resistive layer are performed in a plasma dry etching apparatus.

5. The method of claim 4, wherein the fluorine system gas is tetrafluoro carbon gas.

6. The method of claim 5, wherein:
the thin film resistive layer is formed on the substrate, with an oxide film interposed between the thin film resistive layer and the substrate;
said etching of the barrier metal layer comprises setting a ratio of an oxygen gas flow rate to an entire etching gas flow rate in a range of 20% to 70%; and
said etching of the thin film resistive layer comprises setting the ratio of the oxygen gas flow rate to the entire etching gas flow rate to more than 80%.

7. The method of claim 6, wherein:
the mask pattern is made of organic material including C—H groups; and
said etching of the barrier metal layer comprises transforming C—H groups in the mask pattern into C—F groups by the fluorine system gas in the etching gas.

8. The method of claim 6, wherein said etching of the barrier metal layer comprises setting the ratio of the oxygen gas flow rate to the entire etching gas flow rate to less than 50%.

9. The method of claim 1, wherein said etching of the barrier metal layer comprises etching under conditions that an etching selectivity of the exposed surface portion of the barrier metal layer to the thin film resistive layer is larger than approximately 10.

10. The method of claim 1, wherein said etching of the barrier metal layer consists of dry etching the exposed surface portion with the etching gas.

11. The method of claim 1, further comprising controlling a content of the oxygen gas in the etching gas for said etching of the barrier metal layer so that an etching rate at which the exposed portion of the barrier metal layer is etched is larger than an etching rate at which the mask pattern is etched.

12. A method of manufacturing a thin film resistor on a substrate, the method comprising:
forming a thin film resistive layer on the substrate;
forming a barrier metal layer on the thin film resistive layer;
forming a mask pattern on the barrier metal layer to expose a surface portion of the barrier metal layer;
etching the barrier metal layer from the exposed surface portion through the mask pattern by using an etching gas including fluorine system gas and oxygen gas, a content of the oxygen gas in the etching gas being in a range of 20% to 70% by volume; and
etching the thin film resistive layer.

13. The method of claim 12, wherein said etching of the barrier metal layer comprises setting the content of the oxygen gas in the etching gas to less than 50%.

14. The method of claim 12, wherein the fluorine system gas is tetrafluoro carbon gas.

15. The method of claim 12, wherein said etching of the barrier metal layer and said etching of the thin film resistive layer are performed in a plasma dry etching apparatus.

16. The method of claim 12, wherein:
the thin film resistive layer includes chromium and silicon; and
the barrier metal layer includes at least one of titanium and tungsten.

17. The method of claim 12, wherein said etching of the barrier metal layer consists of dry etching the exposed surface portion with the etching gas.

18. The method of claim 12, further comprising controlling a content of the oxygen gas in the etching gas for said etching of the barrier metal layer so that an etching rate at which the exposed portion of the barrier metal layer is etched is larger than an etching rate at which the mask pattern is etched.

19. A method of manufacturing a thin film resistor, the method comprising:
forming a thin film resistive layer on a substrate;
forming a barrier metal layer on the thin film resistive layer;
disposing a mask layer patterned on the barrier metal layer to expose a surface portion of the barrier metal layer; and
dry-etching the barrier metal layer and the thin film resistive layer through the mask pattern using an etching gas including fluorine system gas and oxygen gas, wherein a ratio in content of the fluorine system gas to the oxygen gas in the etching gas during said dry-etching of the barrier metal layer is different from that during said dry-etching of the thin film resistive layer.

20. The method of claim 19, wherein the etching gas has a smaller content of oxygen gas during said dry-etching of the barrier metal layer than during said dry-etching of the thin film resistive layer.

21. The method of claim 19, wherein:
the thin film resistive layer includes chromium and silicon; and
the barrier metal layer includes at least one of titanium and tungsten.

22. The method of claim 19, wherein:
said dry-etching of the barrier metal layer comprises setting the content of the fluorine system gas to be larger than the content of the oxygen gas in the etching gas; and
said dry-etching of the thin film resistive layer comprises setting the content of the oxygen gas to be larger than that of the fluorine system gas in the etching gas.

23. The method of claim 19, wherein said dry-etching of the barrier metal layer and said dry-etching of the thin film resistive layer are conducted in a plasma dry etching apparatus.

24. The method of claim 19, wherein the fluorine system gas is tetrafluorocarbon gas.

25. The method of claim 19, wherein:
said dry-etching of the barrier metal layer comprises setting a first ratio of an oxygen gas flow rate to an entire etching gas flow rate in a range of 20% to 70%; and
said dry-etching of the thin film resistive layer comprises setting a second ratio of the oxygen gas flow rate to the entire etching gas flow rate to more than 80%.

26. The method of claim 25, wherein the first ratio is less than 50%.

27. The method of claim 19, wherein said dry-etching of the barrier metal layer comprises etching under conditions that an etching selectivity of the exposed surface portion of the barrier metal layer to the thin film resistive layer is larger than approximately 10.

28. A method of manufacturing a thin film resistor, the method comprising:
forming an underlying insulation layer on a substrate;
forming a thin film resistive layer on the underlying insulation substrate;
forming a barrier metal layer on the thin film resistive layer;
disposing a patterned mask on the barrier metal layer to expose a surface portion of the barrier metal layer;

dry-etching the barrier metal layer through the mask layer using a first etching gas including fluorine system gas and oxygen gas, a first ratio in content of the fluorine system gas to the oxygen gas of the first etching gas being controlled so that an etching rate of the barrier metal layer is larger than an etching rate of the mask; and dry-etching the thin film resistive layer through the mask and the barrier metal layer using a second etching gas including the fluorine system gas and the oxygen gas, a second ratio in content of the fluorine system gas to the oxygen system gas of the second etching gas being different than the first ratio and controlled so that an etching rate of the thin film resistive layer is larger than an etching rate of the underlying insulation layer.

29. The method of claim 28, wherein the first etching gas etches the barrier metal layer at a higher etching rate than an etching rate at which the first etching gas etches the thin film resistive layer.

30. The method of claim 28, wherein the second etching gas etches the thin film resistive layer at a higher etching rate than an etching rate at which the second etching gas etches the barrier metal layer.

31. The method of claim 28, wherein the underlying insulation layer is made of silicon oxide.

32. The method of claim 28, wherein:
the thin film resistive layer includes chromium and silicon; and
the barrier metal layer includes at least one of titanium and tungsten.

33. The method of claim 28, wherein:
the first etching gas contains the fluorine system gas in a content that is higher than a content of the oxygen gas contained in the first etching gas; and
the second etching gas contains the oxygen gas in a content that is higher than a content of the fluorine system gas in the second etching gas.

34. The method of claim 28, wherein said dry-etching of the barrier metal layer and said dry-etching of the thin film resistive layer are conducted in a plasma dry etching apparatus.

35. The method of claim 28, wherein the fluorine system gas is tetrafluorocarbon gas.

36. The method of claim 28, wherein:
a ratio of an oxygen gas flow rate to an entire etching gas flow rate in the first etching gas is in a range of 20% to 70%; and
a ratio of the oxygen gas flow rate to the entire etching gas flow rate in the second etching gas is more than 80%.

37. The method of claim 36, wherein the ratio of the oxygen gas flow rate to the entire etching gas flow rate in the first etching gas is less than 50%.

38. The method of claim 28, wherein said dry-etching of the barrier metal layer comprises etching under conditions that an etching selectivity of the barrier metal layer to the thin film resistive layer is larger than approximately 10.

39. The method of claim 28, wherein the first and second etching gases have identical compositions.

40. A method of manufacturing a thin film resistor, the method comprising:
forming a thin film resistive layer on a substrate;
forming a barrier metal layer on the thin film resistive layer;
disposing a mask layer on the barrier metal layer to expose a surface portion of the barrier metal layer, the mask layer being patterned and including C—H groups;

dry-etching the barrier metal layer through the mask layer using a first etching gas; and dry-etching the thin film resistive layer through the mask layer and the barrier metal layer using a second etching gas, wherein each of the first etching gas and the second etching gas includes a fluorine system gas and oxygen gas, and wherein a ratio in content of the fluorine system gas to the oxygen gas in the first etching gas is different than the ratio in the second etching gas to permit etching of the barrier metal layer to be conducted at a faster etching rate than said etching of the mask layer with the first etching gas.

41. The method of claim 40, wherein the first etching gas and the second etching gas have identical compositions.

42. The method of claim 40, wherein the first etching gas etches the barrier metal layer at a higher etching rate than an etching rate at which the thin film resistive layer is etched by the first etching gas.

43. The method of claim 42, wherein the content of the oxygen gas in the first etching gas is smaller than that in the second etching gas.

44. The method of claim 40, wherein:
the thin film resistive layer includes chromium and silicon; and
the barrier metal layer includes at least one of titanium and tungsten.

45. The method of claim 40, wherein:
the first etching gas contains the fluorine system gas in a higher content than that of the oxygen gas contained in the first etching gas; and
the second etching gas contains the oxygen gas in a higher content than that of the fluorine system gas in the second etching gas.

46. The method of claim 40, wherein said dry-etching of the barrier metal layer and said dry-etching of the thin film resistive layer are conducted in a plasma dry etching apparatus.

47. The method of claim 40, wherein the fluorine system gas is tetrafluorocarbon gas.

48. The method of claim 40, wherein:
a ratio of an oxygen gas flow rate to an entire etching gas flow rate in the first etching gas is in a range of 20% to 70%; and
a ratio of the oxygen gas flow rate to the entire etching gas flow rate in the second etching gas is more than 80%.

49. The method of claim 40, wherein the ratio of the oxygen gas flow rate to the entire etching gas flow rate in the first etching gas is less than 50%.

50. The method of claim 40, wherein said dry-etching of the barrier metal layer comprises etching under conditions that an etching selectivity of the barrier metal layer to the thin film resistive layer is larger than approximately 10.

51. The method of claim 40, wherein:
said etching of the barrier metal layer comprises transforming C—H groups in the mask pattern into C—F groups by the fluorine system gas in the first etching gas to reduce etching of the mask layer by the second etching gas; and
the second etching gas has a larger oxygen gas content that the first etching gas.

52. A method of manufacturing a thin film resistor on a substrate, the method comprising:
forming a thin film resistive layer on the substrate;

forming a barrier metal layer on the thin film resistive layer;

forming a mask pattern on the barrier metal layer to expose a surface portion of the barrier metal layer;

dry-etching the barrier metal layer, said dry-etching consisting of dry-etching the barrier layer through the mask pattern with an etching gas including fluorine system gas and oxygen gas and activating the etching gas with plasma; and dry-etching the thin film resistive layer.

* * * * *